US012730957B1

(12) United States Patent
Brown et al.

(10) Patent No.: US 12,730,957 B1
(45) Date of Patent: Sep. 8, 2026

(54) ROUTE-BASED CELL MERGING

(71) Applicant: Cadence Design Systems, Inc., San Jose, CA (US)

(72) Inventors: Edward Brown, Cranleigh (GB); William Robert Reece, Over (GB); Thomas Andrew Newton, Great Cambourne (GB); Natarajan Viswanathan, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 648 days.

(21) Appl. No.: 18/226,220

(22) Filed: Jul. 25, 2023

(51) Int. Cl.
*G06F 30/396* (2020.01)
*G06F 30/394* (2020.01)

(52) U.S. Cl.
CPC .......... *G06F 30/394* (2020.01); *G06F 30/396* (2020.01)

(58) Field of Classification Search
CPC ............................ G06F 30/394; G06F 30/396
See application file for complete search history.

(56) References Cited

U.S. PATENT DOCUMENTS

| | | | | |
|---|---|---|---|---|
| 9,135,375 | B1 * | 9/2015 | Sood | G06F 30/00 |
| 12,430,489 | B1 * | 9/2025 | Chapman | G06F 30/396 |
| 2016/0269009 | A1 * | 9/2016 | Samson | H03K 5/135 |

* cited by examiner

*Primary Examiner* — Nghia M Doan
(74) *Attorney, Agent, or Firm* — Schwegman Lundberg & Woessner, P.A.

(57) ABSTRACT

Methods and systems for performing route-based cell merging for a clock tree. The methods and systems access, from memory, a circuit design comprising a clock tree that interconnects a clock source to a plurality of clock sinks through a plurality of components. The methods and systems generate a Steiner tree that represents at least a portion of the clock tree including a portion of the plurality of components and identify two or more components of the portion of the plurality of components in the Steiner tree that are part of a direct fanout of a common node representing a set of components of the plurality of components. The methods and systems determine that the identified two or more components satisfy a mergeability function and, in response, modify at least a portion of the clock tree by merging the set of components into a single component.

20 Claims, 11 Drawing Sheets

? Unevaluated Merge
× Failed Merge
✓ Successful Merge
○ Initial Point
Steiner Point
Merge Point
Merge Point and Initial Point at the same physical location (and directly connected as if where all inputs originally connected to ○ now connect to )

600

Mergeability Function
(Associative and Commutative)

ROUTE-BASED CELL MERGING

TECHNICAL FIELD

The present disclosure generally relates to the technical field of circuit design. In particular, the present disclosure addresses systems and methods for performing post-clock tree synthesis (CTS) modification using cell/component merging.

BACKGROUND

An integrated circuit (IC) layout specifies portions of various components of an IC. An IC typically includes a large number of registers, latches, inverters, buffers, flip-flops and/or other types of clocked devices, which are referred to herein generally as “clock sinks,” (“sinks”). These clock sinks must be clocked by one or more clock signals in the IC, and the IC must include one or more clock trees for distributing a clock signal from a clock source to all of the clock sinks to be clocked by the clock signal. A clock tree distributes a clock signal from its root node (also referred to as a net) to a set of clock sinks within an IC through a branching network of drivers (e.g., buffers or inverters, multiplexors, clock gates, logic elements, also referred to as separate nets or cells). A single driver distributes the clock signal to a grouping of other drivers and/or clock sinks. Connectivity between a driver and its fanout to other drivers or sinks is represented by a “clock net” and will be physically implemented by routed conductive traces, which may be referred to simply as “routes” herein. CTS is the process of structuring a clock tree to provide the clock signal from the root to all the clock sinks so that the clock signal ideally arrives at, or is received by, all clock sinks at the same time.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

FIG. 6 illustrates an example of a mergeability function, in accordance with some examples.

DETAILED DESCRIPTION

Figure 1:
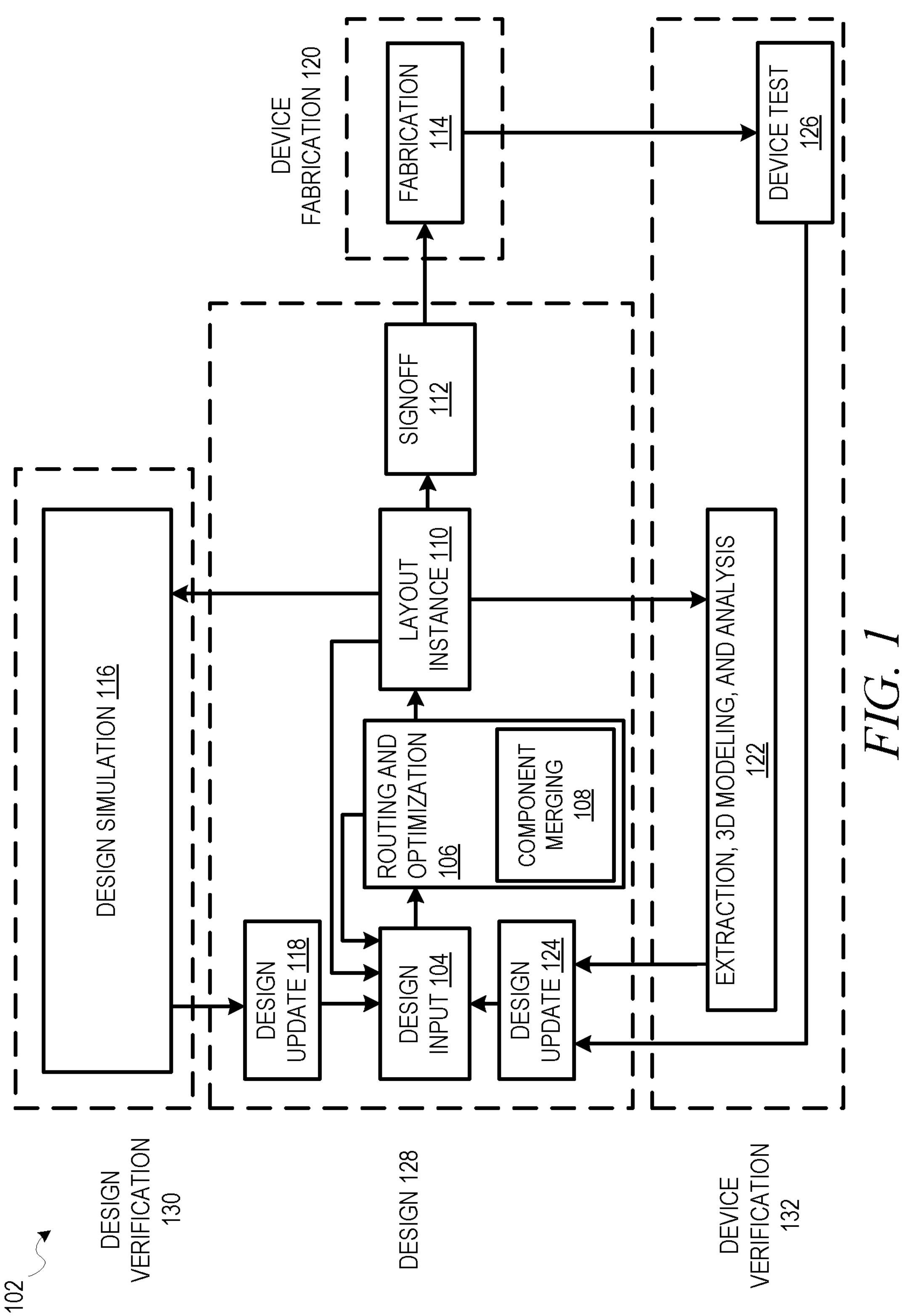
FIG. 1 illustrates an example design process flow that includes post-CTS clock tree modifications to a clock tree, in accordance with some examples.

Reference will now be made in detail to specific examples for carrying out the inventive subject matter. The examples are illustrated in the accompanying drawings, and specific details are set forth in the following description in order to provide a thorough understanding of the subject matter. It will be understood that these examples are not intended to limit the scope of the claims. On the contrary, they are intended to cover such alternatives, modifications, and equivalents as may be included within the scope of the disclosure.

Electronic Design Automation (EDA) software systems commonly perform CTS. Conventional approaches to CTS typically include a labor-intensive process that generates a mapping of clock signals to each clock sink within a design. Generally, buffers and inverters are inserted along a clock path to achieve required transition times (e.g., slew) of the clock signal propagating through the clock tree. The clock tree is also structured to meet required insertion delay and skew for the clock sinks. The meaning of the terms slew, insertion delay, and skew of clock sinks in a clock tree are discussed in more detail below. For ICs, a clock tree structure typically consumes 15-30% of total power consumption and may consume up to approximately half of the total power consumption of the IC. Improved clock tree structures may reduce power consumption in the clock tree and thereby help reduce the total power consumption of the IC.

CTS is the process of structuring a clock tree to provide the clock signal from the root to all the clock sinks so that the clock signal ideally arrives at or is received by all clock sinks at the same time. The clock signal can be called a propagated clock signal as the clock signal is communicated from or “propagates” from the root through drivers and conductive traces to the clock sinks. Drivers are included in the clock tree to ensure the propagated clock signal meets required transition time or slew rate specifications for the clock tree. The clock tree may be structured or synthesized so that the propagated clock signal meets the required slew rate specifications as well as required insertion delay and skew for all the clock sinks in the clock tree. After a clock tree has been synthesized, which will be referred to herein as “post-CTS”, modifying the clock tree is a difficult and time-consuming process. While this is true, the need arises regularly to make post-CTS clock tree modifications to the clock tree as designers of an IC including the clock tree refine their circuit designs and test the operation of the IC. There is accordingly a need for improved techniques for making post-CTS clock tree modifications to a clock tree.

Existing techniques in EDA software systems for restructuring or modifying a clock tree after CTS have been limited up to now. As the CTS generates a clock tree in a holistic manner, any restructuring of one clock sink in the clock tree after the generation can impact characteristics of the clock signal applied to other clock sinks in the clock tree. Some modifications to the clock tree post-CTS may be implemented through changing the sizing of buffers to adjust or modify slew or transition times of the propagating clock signal. This approach of adding, removing, or resizing of buffers is impracticable to implement, however, to adjust numerous targeted individual clock sinks throughout the clock tree. This is true because of the consequences of adjustments to fix one parameter or design rule of the clock tree may cause other design rules to be violated. For example, a design rule violation (DRV), such as a slew rate or transition time violation, of a given clock sink in the clock tree may be fixed, for example, by increasing a size of a buffer driving the clock signal applied to the clock sink. A larger buffer will reduce the transition time of the applied clock signal, but this will also reduce the insertion delay of the clock sink, which may undesirably increase the skew of this clock sink.

Some existing techniques in EDA software systems combine common components, such as inverters and buffers into individual components in an attempt to restructure and improve the clock tree. For example, if two inverters receive a same input signal and are being used to drive respective components, the two inverters can be combined logically into a single inverter to achieve the same function logically. However, the manner in which existing techniques combine such components is without regard to a change in the wirelength. Namely, combining the two inverters into a single inverter can end up increasing or decreasing the wirelength that is perceived by the respective components which can violate some design rules and timing constraints, such as the clock skew that the respective components receive. These operations can thus have adverse effects and are therefore commonly avoided.

Examples of the present disclosure are directed to EDA software systems that implement techniques for automatically modifying a post-CTS clock tree to combine components (e.g., pairs of inverters) in a circuit design without increasing/decreasing or otherwise affecting the wirelength or with minimal modification to the wirelength to eliminate violations of skew design parameters for the clock tree. Namely, the disclosed techniques can combine (e.g., merge) two components into a single component that drives a pair of other components without affecting the clock skew that the pair of components receive as a result of such combination. In some cases, the clock skew is not affected when merges that affect clock skew are checked and/or rejected. To do so, the disclosed techniques leverage Steiner trees that represent the post-CTS clock tree and apply various mergeability rules/functions to nodes of the Steiner tree to selectively and conditionally merge certain components of the clock tree. In general, the examples below relate to Steiner trees, however, any function related to Steiner tree can similarly be performed by any other type of routing tree, including MST, Prim-Dijkstra, global, and detailed routing trees.

Briefly, in some examples, the disclosed techniques access, from memory, a circuit design including a clock tree that interconnects a clock source to a plurality of clock sinks through a plurality of components. The disclosed techniques generate a Steiner tree (or any other type or routing tree) that represents at least a portion of the clock tree including a portion of the plurality of components and identify two or more components of the portion of the plurality of components in the Steiner tree that are part of a direct fanout of a common node representing a set of components of the plurality of components. The disclosed techniques determine that the identified two or more components satisfy a mergeability function and, in response, modify at least a portion of the clock tree by merging the set of components into a single component. In this way, examples of the present disclosure allow for post-CTS modifications to the clock tree while eliminating the need for designer input relating to these modification as well as eliminating the need to perform the time and resource intensive process of again performing CTS to generate a new clock tree.

In some examples, the components that are combined/merged include a pair of inverters and/or buffers. In some examples, the common node is coupled to the clock source, a buffer, or an inverter. In some examples, a wirelength of the circuit design is increased by a negligible amount in response to merging the set of components into the single component. In some examples, the merging the set of components into the single component includes merging the set of components without increasing the wirelength of the circuit design.

In some examples, in response to determining that the identified two or more components satisfy the mergeability function, the disclosed techniques access user constraints, transition constraints, and timing constraints associated with the circuit design. The disclosed techniques condition merging the two or more components into the single component in response to determining that merging the set of components continue to satisfy the user constraints, transition constraints, and timing constraints associated with the circuit design.

In some examples, generating the Steiner tree includes selecting a net driver from the clock tree; identifying a group of components of the plurality of components that are part of a direct fanout of the net driver. Within the group of components, the techniques identify a first set of components that are mergeable and a second set of components that are not mergeable and exclude the first set of components from the Steiner tree while including a third set of components in a fanout path from the first set of components and including the second set of components, each of the third set of components and the second set of components being associated with a respective initial point in the Steiner tree. In some examples, the Steiner tree is constructed with locations of inputs to the direct fanout of the net driver which is not mergeable and locations of the inputs to a fanout of the direct fanout which is mergeable.

In some examples, the techniques generate horizontal and vertical line segments from the net driver to each component of the third set of components and the second set of components. The Steiner tree can include a set of Steiner points at junctions and corners where perpendicular line segments of the horizontal and vertical line segments meet. In some examples, the techniques search the horizontal and vertical line segments to find a set of initial points having multiple edges and replace the set of initial points with merge points.

In some examples, the techniques remove any Steiner point of the set of Steiner points from the Steiner tree having only two edges and mark a remaining set of the Steiner points as merge points. In some examples, the techniques traverse the merge points of the Steiner tree in a bottom up or top down manner to identify merge candidates for which respective components directly connected to the respective merge point satisfy the mergeability function. In some examples, the techniques determine whether the merge candidates satisfy additional constraints associated with the circuit design to conditionally merge the merge candidates. In some examples, the techniques generate a merge tree based on the Steiner tree. The mergeability function can be evaluated using the merge tree. In some cases, once a merge point is found/created, the disclosed techniques can take the incident mergeable fanout and merge them into a new instance at a legal location close to that of the current merge point. So merge point provides information about the cells to be merged and where the new cell can/should be placed.

Reference will now be made in detail to specific examples for carrying out the disclosed subject matter. The examples are illustrated in the accompanying drawings, and specific details are set forth in the following description in order to provide a thorough understanding of the subject matter. The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 is a diagram illustrating an example design process flow 102 of an EDA software system that includes post-CTS clock-tree restructuring, in accordance with some examples. The terms "restructuring," "reformulating," and "modifying" are used interchangeably herein, and each should be understood to mean an update is being made to an existing clock tree, as described in more detail herein in the described examples. As shown in FIG. 1, the design process flow 102 includes a design phase 128, a device fabrication phase 120, a design verification phase 130, and a device verification phase 132. The design phase 128 involves an initial design input operation 104 where basic elements and functionality of a device, typically an IC, are determined. The initial design input operation 104 may also include revisions to elements or functionality of the device based on various analyses and optimization of a circuit design to be include in the device. This initial design input operation 104 is where block instances are used in the circuit design and any additional circuitry for the design around the blocks is selected. The initial strategy, tactics, and context for the device to be created are also generated in the initial design input operation 104, depending on the particular design algorithm being used.

In some examples, following an initial selection of design values in the design input operation 104, routing, timing analysis, and optimization are performed in a routing and optimization operation 106, along with any other automated design processes. While the design process flow 102 shows the routing and optimization operation 106 occurring prior to a layout instance operation 110, routing, timing analysis, and optimization in operation 106 may be performed at any time to verify operation of a circuit design. For instance, in various embodiments, timing analysis in a circuit design may be performed prior to routing of connections in the circuit design, after routing, during register transfer level (RTL) operations, or as part of a signoff operation 112, as will be understood by those skilled in the art.

In FIG. 1, the routing and optimization operation 106 includes a component-merging 108 operations, which may be performed in accordance with various examples described herein. The component-merging 108 operation processes the clock tree using a Steiner tree to selectively and conditionally combine certain components of the clock tree into a single component (e.g., single inverter) without modifying or with minimal modification to the wirelength between a root and a clock sink.

In general, a clock tree can include buffers (which can include any number of components or be implemented by any type of circuit component) for distributing the clock signal CLK to groups of clock sinks. There may be millions of clock sinks in the clock tree of an IC and thus these clock sinks are commonly divided into groups, each of these groups driven by appropriately sized buffers in the clock tree. The clock tree can include logic circuitry coupled between pairs of clock sinks. During operation of the IC, the clock sinks are clocked to, for example, clock data into and out of blocks of logic circuitry. Skew in a clock tree is the difference in insertion delay ID among the clock sinks, and thus indicates differences in time at which respective clock sinks receive the propagated clock signal. Varying a wirelength can impact the clock skew received by the clock sinks. As such, the disclosed examples, combine certain components into single components without adversely affecting the wirelength.

Skews introduced by a length of a path (e.g., route) can change based on environmental conditions whereas skews introduced by respective buffers are less prone to changes due to environmental condition. As such, it may be more desirable to generate skew using multiple buffers rather than relying on increasing/decreasing a path length from the root node to the clock sink. The disclosed examples utilize a Steiner tree representing the clock sinks in the clock tree to selectively combine certain components of the post-CTS clock tree and to modify the post-CTS clock tree accordingly. While the implementation of this disclosure is discussed with respect to combining inventers in the clock tree into a single inverter, any other type of component or circuit element can be similarly combined in addition to, in combination with, or in alternative to the inverters as long as those components satisfy the mergeability function or criteria (e.g., are identical logic elements that do not violate circuit constraints by being combined).

The component-merging 108 operation accesses an initial clock tree and constructs a Steiner tree for the initial clock tree through a suitable technique, such as, for example, using the Steiner-tree approach. With the Steiner-tree approach, a Rectilinear Steiner Tree (RST) (e.g., a minimum RST) is used for routing a multi-pin clock net with minimum length for conductive traces or routes connecting to the clock sinks. Given m points in the plane, an RST connects all points by rectilinear lines, possibly via some extra points (called Steiner points), to achieve a minimum-length tree of rectilinear edges.

In FIG. 1, after design inputs are used in the design input operation 104 to generate a circuit layout for the functional circuitry of the device being designed, and the routing and optimization operation 106 is performed, a layout is generated in the layout instance operation 110. The layout describes the physical layout dimensions of the device that matches the design inputs. Prior to this layout being provided to a fabrication operation 114, the signoff operation 112 is performed on the circuit design defined by the layout.

After signoff verification by the signoff operation 112, a verified version of the layout is used in the fabrication operation 114 to generate a device, or additional testing and design updates may be performed using designer inputs or automated updates based on design simulation operations 116, or extraction, 3D modeling, and analysis operations 122. Once the device is generated, the device can be tested as part of device test operation 126, and layout modifications generated based on actual device performance.

A design update operation 118 from the design simulation operation 116, a design update operation 124 from the device test operation 126 or the extraction, 3D modeling, and analysis operations 122, or the design input operation 104 may occur after the initial layout instance operation 110 is performed and/or incorporated into CTS as well as a post CTS fix-up. In various examples, whenever design inputs are used to update or change an aspect of a circuit design, a timing analysis and the routing and optimization operation 106 may be performed.

A global and detailed routing operation can reroute the initial conductive trace routing generated in the Steiner-tree routing with actual physically routing of conductive traces that may be used to connect to the clock sinks. For example, the conductive routes generated through the Steiner-tree routing can be physically positioned so that the conductive routes do not short circuit with one another. A detailed routing operation fine-tunes the clock tree being synthesized, eliminating any design rule violations arising from the global routing and ensuring that the clock tree is physically synthesizable for the IC being designed. The fine-tuning of the clock tree in the detailed routing portion of operation may result in violations of required operating parameters of the clock tree. For example, repositioning of selected conductive routes during detailed routing may change the capacitance of some of these conductive routes, and this change in capacitance may result in transition time or slew violations for the propagated clock signal on these conductive routes. A post-conditioning operation fixes slew violations that arise as a result of the detailed routing operation.

Figure 2A:
FIGS. 2A-2B illustrate examples of post-CTS clock tree Steiner tree generation, in accordance with some examples.
Figure 2A:
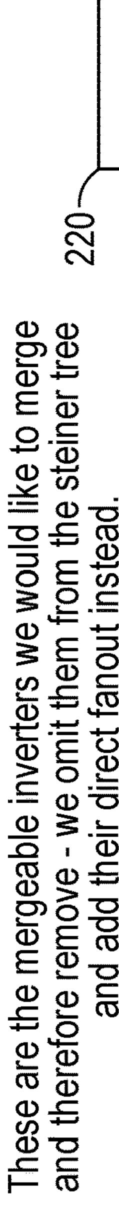
Figure 2A:
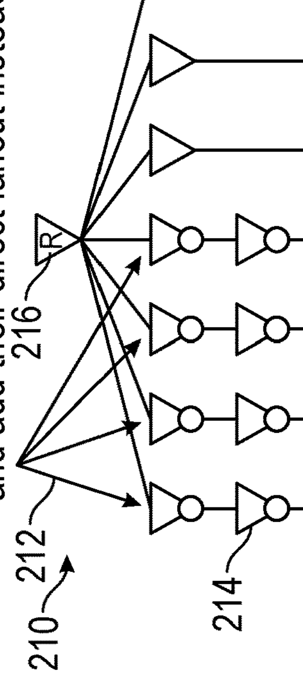
Figure 2B:
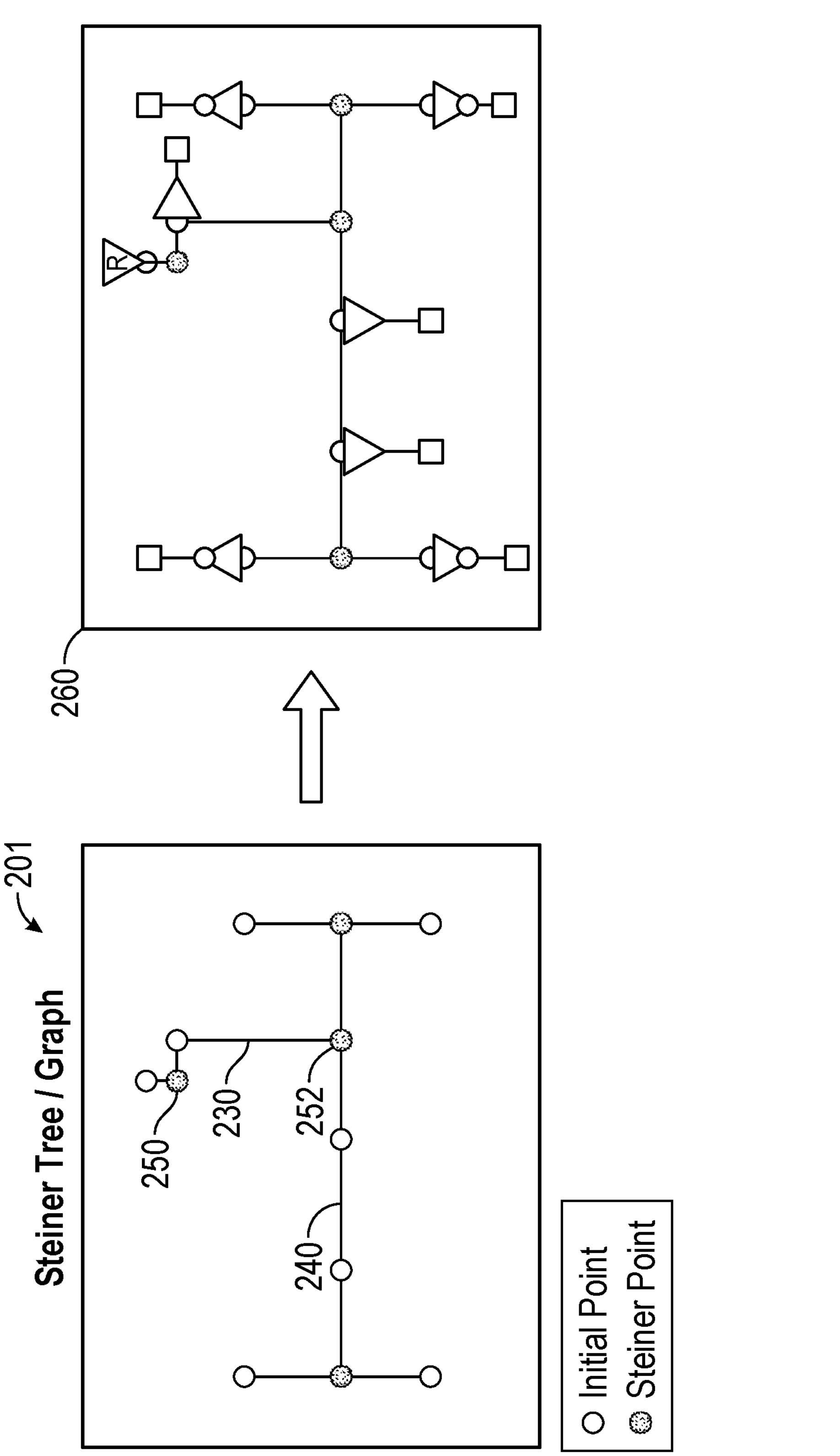

FIGS. 2A-2B illustrate examples of post-CTS clock tree Steiner tree generation, in accordance with some examples. For example, as shown in the diagram 200 of FIG. 2A, the component-merging 108 of FIG. 1 operation can access a circuit design 210 that includes a clock source 216 and various components (e.g., inverters, buffers, and/or clock sinks). The component-merging 108 operation can then process the circuit design 210 to identify mergeable components. Specifically, the component-merging 108 operation can search for any given cell (e.g., the clock source 216) that has in the direct fanout a set of identical logic elements 212 (e.g., a set of inverters). This set of identical logic elements 212 can be the subject of being merged and so are selected to be excluded from the Steiner tree. Namely, because these are identical logic elements (e.g., a group or more than one identical inverter), they can logically be combined into a single component (e.g., a single inverter). In some cases, the component-merging 108 operation can identify a group of identical elements (e.g., buffers) that can also be merged. However, in some cases, buffers can be excluded from merging operations and the component-merging 108 operation can avoid merging buffers into a single component.

The component-merging 108 operation can access configuration information to determine which types of components are allowed to be merged and which types of components are not. The component-merging 108 operation can determine that inverters are allowed to be merged whereas buffers are not. In response, the component-merging 108 operations can select, as a target for possible merging, the set of identical logic elements 212 as they correspond to the type of component that is allowed to be merged. For example, the set of identical logic elements 212 can be merged because they are identical and therefore correspond to the type of component that is allowed to be merged. In some cases, the cells being merged do not need to be "identical" per se. They can be "equivalent" cells which can be merged logically, such as because they have different sizes. Namely, two buffers that are different in size are not identical but are equivalent because they perform the same logical function. Such equivalent cells can be merged in the same manner, as discussed below, as "identical" cells. The component-merging 108 operation can exclude a selection of the set of buffers that are in the direct fanout path of the given cell (e.g., the clock source 216) because the buffers may fall into the class or type of components that are not allowed to be merged.

The component-merging 108 operation can then identify a set of components 214 that are in the fanout path of each of the set of identical logic elements 212. The component-merging 108 operation can include the set of components 214 in the Steiner tree representation of the circuit design 210. The component-merging 108 operation can determine that various clock sinks are not affected by merging of the set of identical logic elements 212 and so can exclude such clock sinks from the Steiner tree. Other elements, such as the group of buffers that are not mergeable (e.g., because the configuration information excludes such types of components from being merged) and that are in the direct fanout of the given cell (e.g., the clock source 216) are included in the Steiner tree representation of the circuit design 210.

The component-merging 108 operation can process the selected components and generate data 220 for input to a Steiner tree generation process representing the components selected for inclusion in the Steiner tree. The data 220 can associate an initial point with each component that is selected from the circuit design 210. The data 220 can include a component 222 corresponding to the clock source 216 and various other components, such as component 224, corresponding to the other components of the circuit design 210 that were selected for inclusion in the data 220. The component 224 can correspond to one of the inverters in the set of components 214.

As shown in the diagram 201 of FIG. 2B, the component-merging 108 operation can generate a set of horizontal and vertical paths or routes interconnecting each of the components of data 220 to generate the Steiner tree shown in FIG. 2B. In some examples, no diagonal paths can be allowed to be drawn by the component-merging 108 operation. The component-merging 108 operation can include one or more Steiner points 250 and 252 representing nodes that connect horizontal paths to vertical paths. For example, the Steiner point 250 connects a vertical path extending from an initial point of the component 222 to a horizonal path extending from an initial point of a second component. Similarly, the Steiner point 252 connects a vertical path extending from the initial point of the second component to the horizontal path 240 extending through initial points of other components along the horizontal path 240. After all of the paths are drawn in the Steiner tree using the data 220, the component-merging 108 operation finalizes the Steiner tree using the data 220 to provide the final Steiner tree 260.

Figure 3:
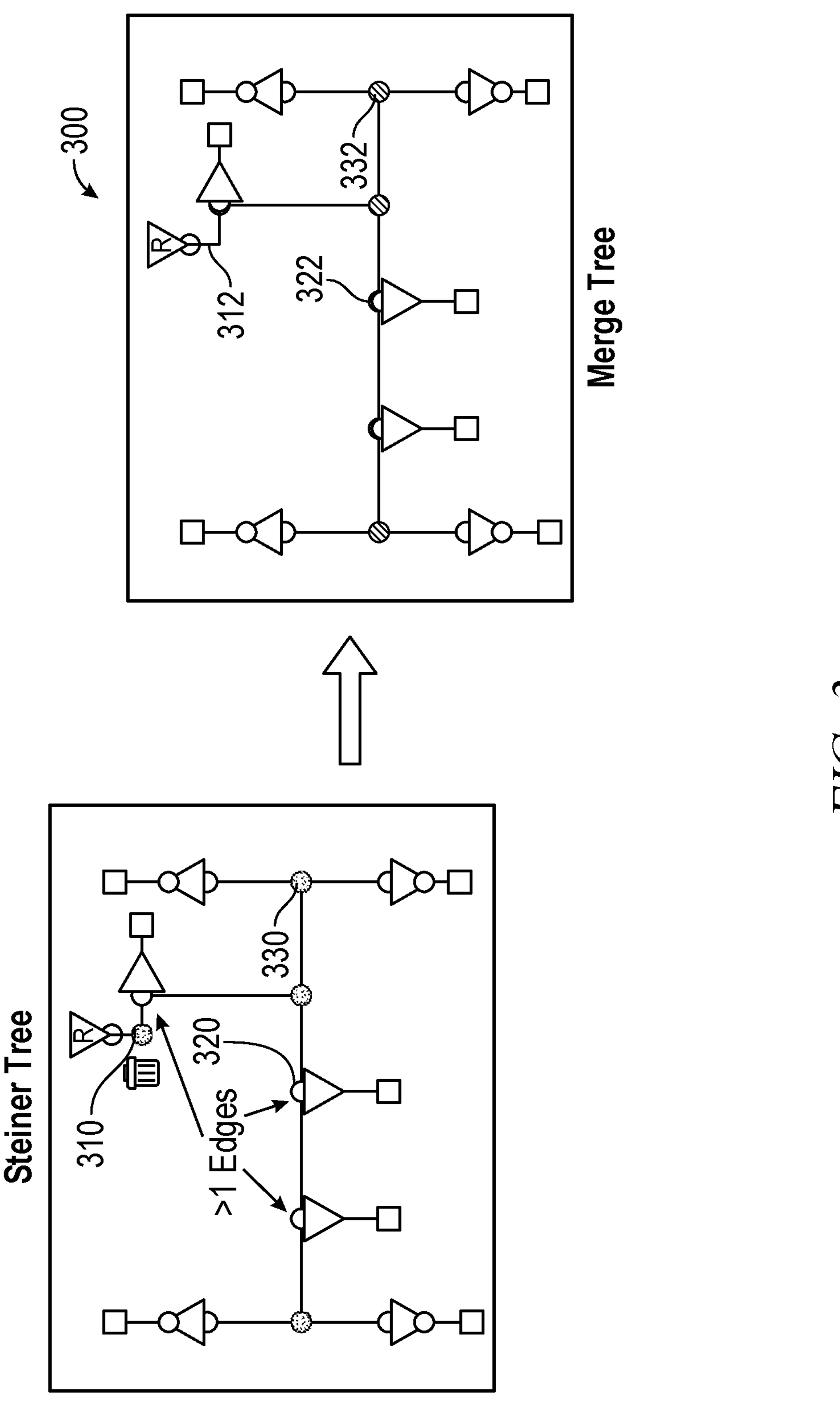
FIG. 3 is an example of a merge tree generated using the Steiner tree, in accordance with some examples.

FIG. 3 is an example of a merge tree 300 generated using the Steiner tree, in accordance with some examples. The component-merging 108 operation can process the final Steiner tree 260 of FIG. 2B to generate a merge tree 300. For example, the component-merging 108 operation can convert initial points and/or Steiner points in the final Steiner tree 260 into merge points based on certain criteria and based on the mergeable fanout of each point. Specifically, the component-merging 108 of FIG. 1 operation can identify any initial point with more than one edge for isolation from the rest of the merge tree 300. The component-merging 108 operation can insert a merge point logically above any such initial point. For example, the component-merging 108 operation can determine that initial point 320 includes more than one edge. In response, the component-merging 108 operation can associate a merge point 322 with that initial point 320 and can identify the mergeable fanout of the merge point 322.

The component-merging 108 operation can remove any Steiner point that is at a corner from the final Steiner tree 260 and can exclude associating such Steiner points with merge points. Namely, the component-merging 108 operation can exclude from consideration for merging any Steiner point with exactly two edges. For example, the component-merging 108 operation can determine that the Steiner point 310 includes exactly two edges and can delete that Steiner point 310 from the merge tree 300. As shown in the merge tree 300, the Steiner point 310 is excluded from being represented at a node 312 where the Steiner point 310 was. The component-merging 108 operation can determine that the Steiner point 330 includes more than two edges. In response, the component-merging 108 operation can convert that Steiner point 330 into a merge point 332 in the merge tree 300.

Figure 4A:
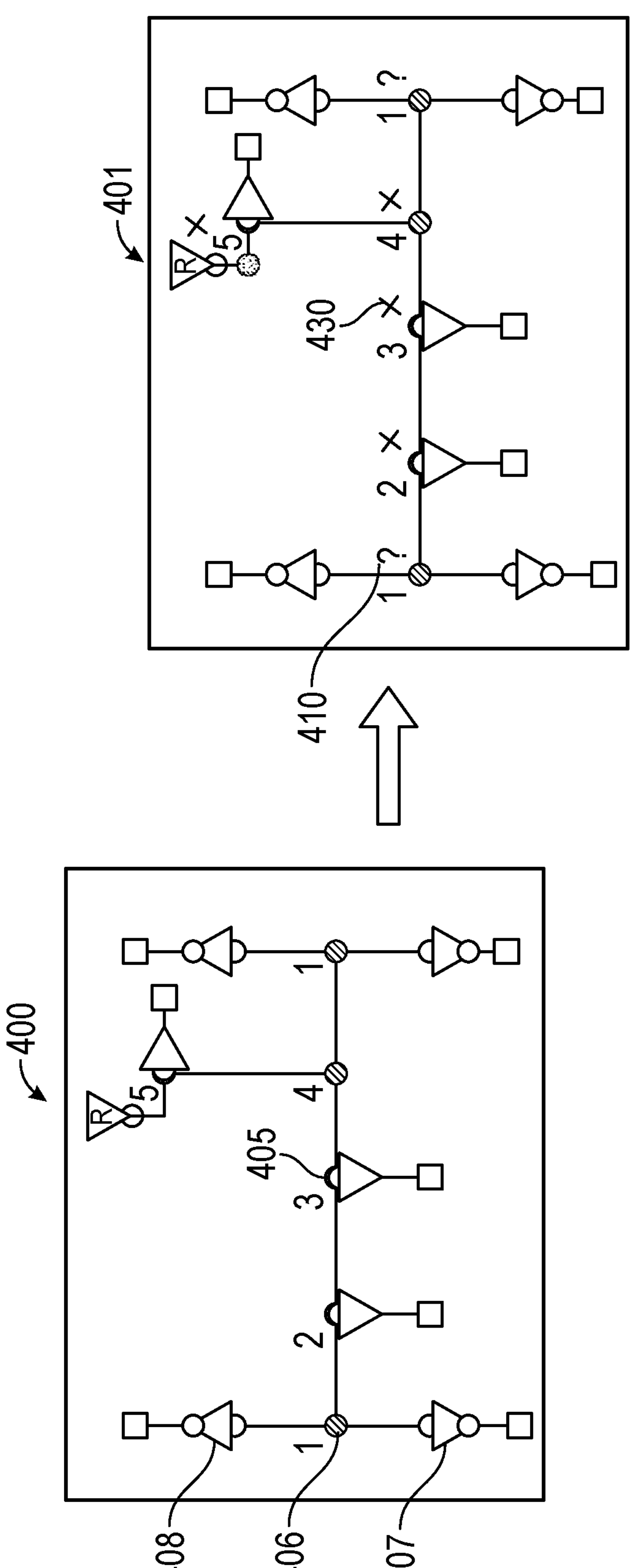
FIGS. 4A and 4B are examples of merge tree merge point evaluations, in accordance with some examples.

FIG. 4A is an example of merge tree merge point evaluations, in accordance with some examples. After the merge tree 300 is generated, the component-merging 108 operation of FIG. 4A can process the merge tree 300, as shown in FIG. 4A, in a bottom up or top down manner to evaluate whether or not a given merge point satisfies a mergeability function. Namely, the component-merging 108 operation can apply the mergeability function to the directly connected nodes of each merge point and can annotate the merge point with its mergeability assessment (e.g., indicating whether or not that merge point can be merged or not). A top down tree traversal requires that each node is only visited once all nodes on the path between it and the root have been visited. Breadth first, depth first traversal or even a concurrent traversal can be applied by the component-merging 108 operation. A bottom up traversal or topological order traversal is the reverse and requires each node to be only visited once all nodes on the paths between it and its transitively connected leaf nodes have been visited.

The mergeability of a given merge point depends on the mergeability of the combination of cells transitively beneath it. If the cell mergeability function is associative and commutative, then mergeability can be computed incrementally starting from the bottom of the tree using just the mergeability of the candidates and cells directly below. For example, as shown in the merge tree 400, the component-merging 108 operation can select the merge point 406 for evaluation against the mergeability function. The component-merging 108 operation can identify the two adjacent components directed connected to the merge point 406, such as a first component 408 (e.g., a first inverter) and a second component 407 (e.g., a second inverter).

Figure 6:
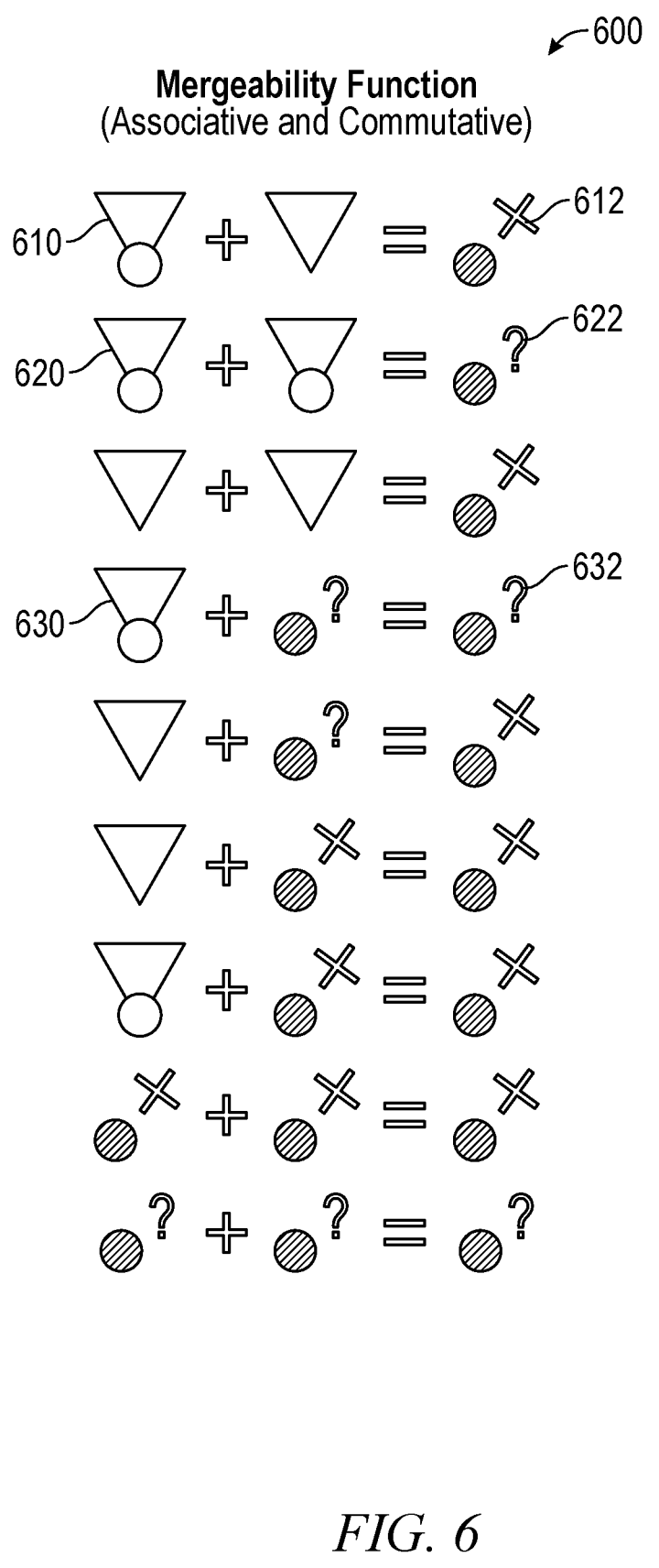

The component-merging 108 operation can access configuration data that defines the mergeability function, such as the mergeability function 600 shown in FIG. 6. The mergeability function 600 can include a list of different criteria indicating whether a given pair or set of components and/or nodes can be merged. The mergeability function 600 can include a first criterion 610 that defines a first pair of components (e.g., an inverter and a buffer) and an outcome 612 indicating that the first pair of components corresponds to a failed merge or are not mergeable. The mergeability function 600 can include a second criterion 620 that defines a second pair of components (e.g., two inverters) and an outcome 622 indicating that the second pair of components corresponds to a possible merge or are mergeable. The mergeability function 600 can include a third criterion 630 that defines a third pair of components (e.g., an inverter and a node with a possible allowable merge) and an outcome 632 indicating that the third pair of components corresponds to a possible merge indicated by a question mark.

The component-merging 108 operation of FIG. 1 can associate the outcome specified in the mergeability function 600 with each merge point in the merge tree 300 of FIG. 3. For example, the component-merging 108 operation can determine that the first component 408 and the second component 407 (both of FIG. 4A) correspond to a possible merge according to the mergeability function 600. As such, the component-merging 108 operation can associate the outcome indicator (e.g., a question mark) 410 with the merge point 406. Similarly, the component-merging 108 operation can select a second merge point 405 of FIG. 4A and identify a set of components directly connected to the second merge point 405, such as a buffer and two other merge points. The component-merging 108 operation can determine that the mergeability function 600 indicates that buffers are associated with failed or disallowed merges and so the component-merging 108 operation can associate the outcome indicator (e.g., an 'x') with the second merge point 405. After all of the merge points in the merge tree 300 are evaluated using the mergeability function 600, the component-merging 108 operation outputs the evaluated merge tree 401 of FIG. 4A that includes the outcome indicator for each merge point.

The component-merging 108 operation can process any merge point that is associated with a possible merge indicator to determine whether the merge point can be successfully merged. Namely, some individual cells are unmergeable, without adding more wire and adjusting the route to isolate the node(s) of this type. The un-mergeability propagates up the merge tree 300. So, for such merge points, the component-merging 108 operation can either change the possible merge outcome with an unsuccessful merge indicator or can isolate the merge point (as explained in FIG. 4B below) and mark the merge point with a successful merge indicator. Specifically, it is possible for a merge point to be mergeable but to be rejected nonetheless for arbitrary reasons, such as a result of static timing analysis (STA) reporting that user constraints, e.g., transition/timing constraints are not met. When this is the case, merge points further down the tree might work.

Figure 4B:
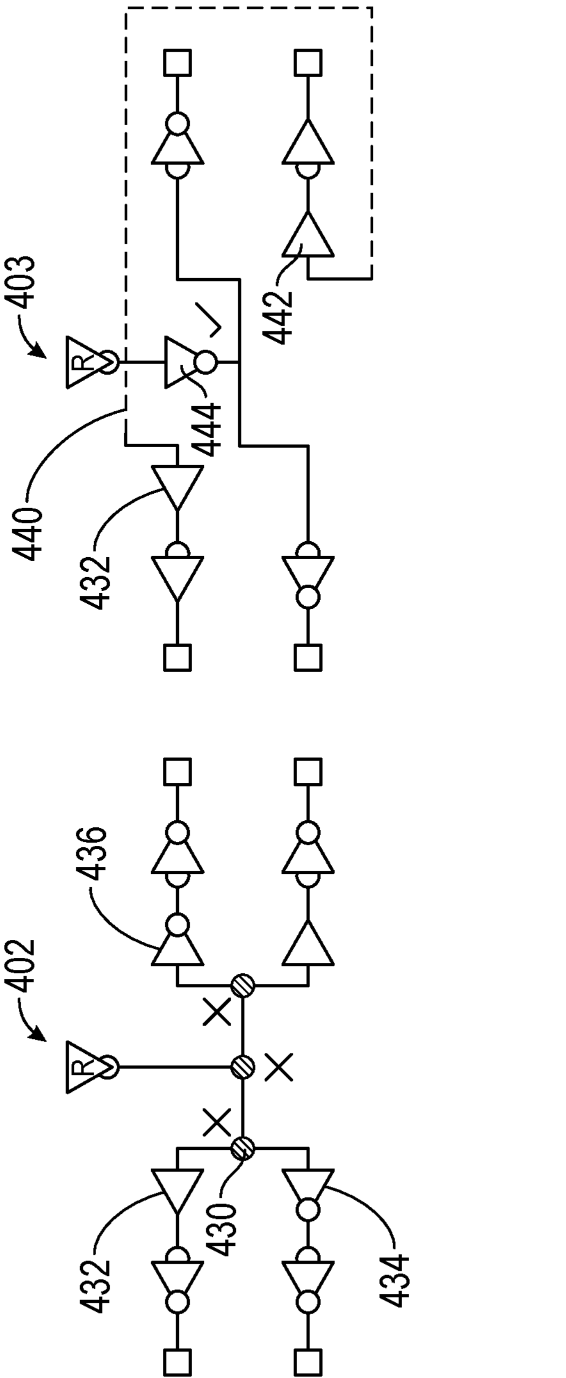

FIG. 4B is an example of merge tree merge point evaluations for points that are unmergeable, in accordance with some examples. Specifically, a set of merge points are shown in the example merge tree 402. The component-merging 108 operation can determine that a first component 434 is identical to a second component 436 and can possibly be merged. However, the component-merging 108 operation determines that the merge point 430 associated with the first component 434 is also associated with a third component 432. The third component 432 is unmergeable with the first component 434, such as because the third component 432 is a buffer and the first component 434 is an inverter. In order to merge the first component 434 with the second component 436, the component-merging 108 operation determines that additional wire is needed to connect the third component 432 with a fourth component 442 that is identical to the third component 432. As shown in the diagram 403, a wire 440 can be added to connect the third component 432 with the fourth component 442 which allows the first component 434 to be merged with the second component 436 using the common component 444. In some cases, adding the additional wire 440 to perform such merging operations can violate mergeability criteria and so the component-merging 108 operation disallows such merges from being performed. If adding wire to enable merges to be performed is allowed by the mergeability criteria, then the merge point is marked as successfully merged, as shown in diagram 403.

Figure 5A:
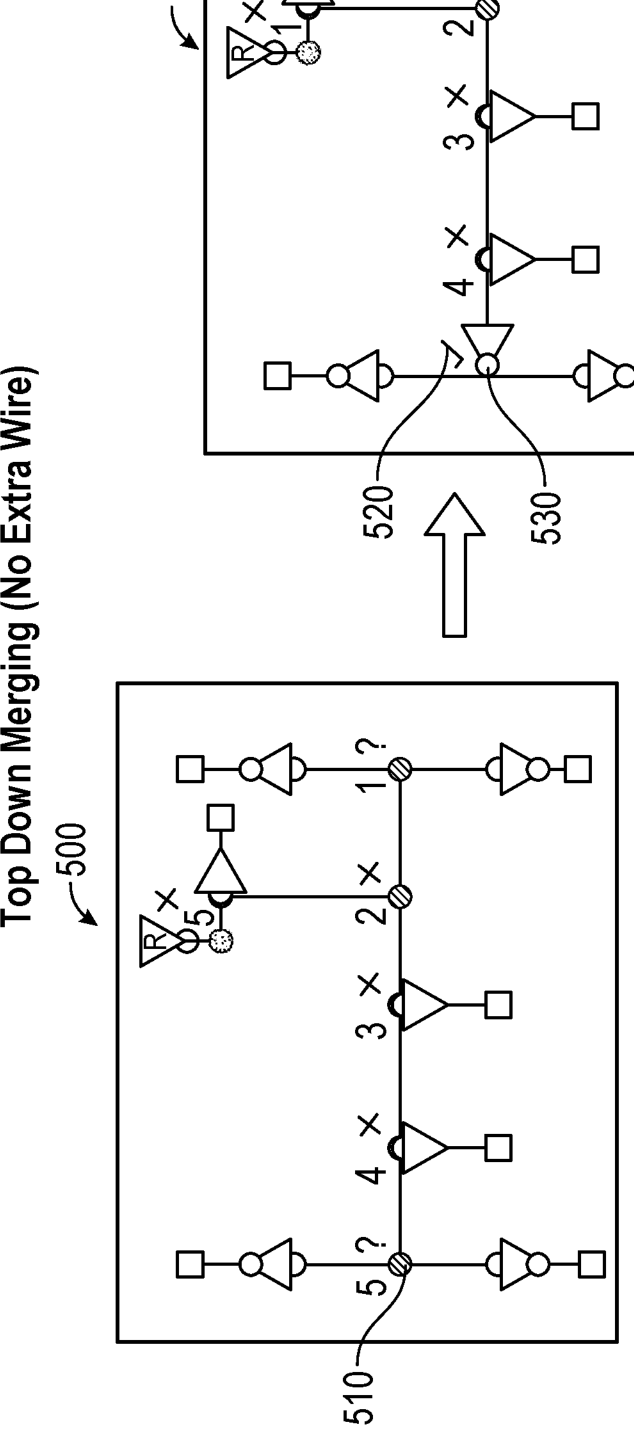
FIG. 5A illustrates an example or merging certain merge points in the merge tree, in accordance with some examples.

FIG. 5A illustrates an example or merging certain merge points in the merge tree 500, in accordance with some examples. Specifically, the component-merging 108 operation of FIG. 1 can traverse the merge points marked as 'mergeable', top-down and tries to apply the merges. The component-merging 108 operation stops on each branch independently at the first successful merge. A merge is 'successful' if it meets the merge criteria, for example if the slew after applying the merge is satisfactory. If the merge is not successful, then revert it and continue.

The component-merging 108 operation keeps a track of the number of successful merges, and repeats from the start, looking for more mergeable fanout until doing a pass with no successful merges. For example, the component-merging 108 operation can select a first merge point 510 which was associated with an outcome indicating a possible merge. The component-merging 108 operation can evaluate a condition indicating whether merging the components associated with that first merge point 510 into a single component will or will not violate merge conditions. Namely, the component-merging 108 operation can determine whether merging the two inverters beneath the first merge point 510 into a single inverter can be performed without adding additional wire or wirelength and can be performed without violating other timing or transition constraints. In response to determining that merging those components can be performed without violating merge conditions, the component-merging 108 operation stores an indication of a successful merge 520 with the first merge point 510 and merges the two inverters associated with the first merge point 510 into a single component 530. Similar operations are performed for other merge points associated with possible merge outcomes. The component-merging 108 operation outputs the final merge tree 501 with the possible outcomes evaluated and the single components being added to the final merge tree 501.

In some cases, rather than or in addition to iteratively looking for more mergeable fanout, the component-merging 108 operation can recursively try to merge components under each fanout of a new (e.g., common) component created as a result of a merge operation. Namely, the component-merging 108 operation, in response to adding or generating a common component to merge two or more components, the component-merging 108 operation evaluates each component in the fanout path of the common component to determine whether such components can be merged, in a similar manner as discussed above.

Figure 5B:
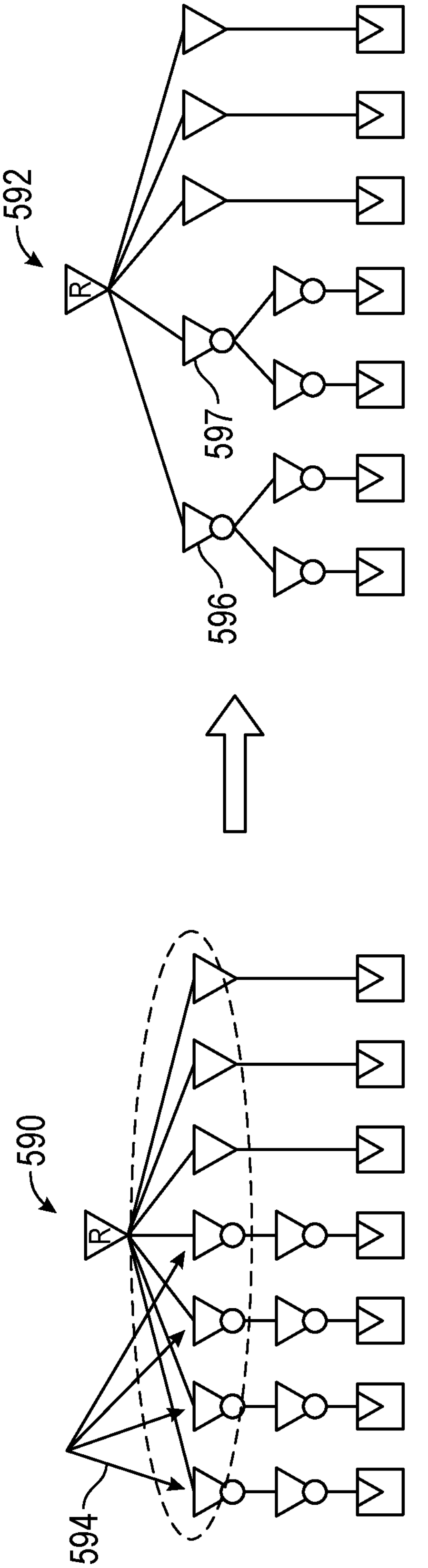
FIG. 5B illustrates an example circuit design showing results of merging the merge points in the merge tree, in accordance with some examples.

FIG. 5B illustrates an example circuit design showing results of merging the merge points in the merge tree, in accordance with some examples. For example, the component-merging 108 operation initially received the circuit diagram 590 in which a set of identical components 594 were identified as candidates for possible merging. After performing the Steiner tree operations discussed above, the component-merging 108 operation reduces the number of components from the set of identical components 594 to generate the merged tree 592. Namely, the component-merging 108 operation merged a first pair of inverters into a first single inverter 596 and a second pair of inverters into a second single inverter 597. The first pair of inverters may correspond to the first merge point 510 and the second pair of inverters can correspond to the other merge point indicated in the merge tree 500 as being associated with a possible merge outcome.

Figure 7:
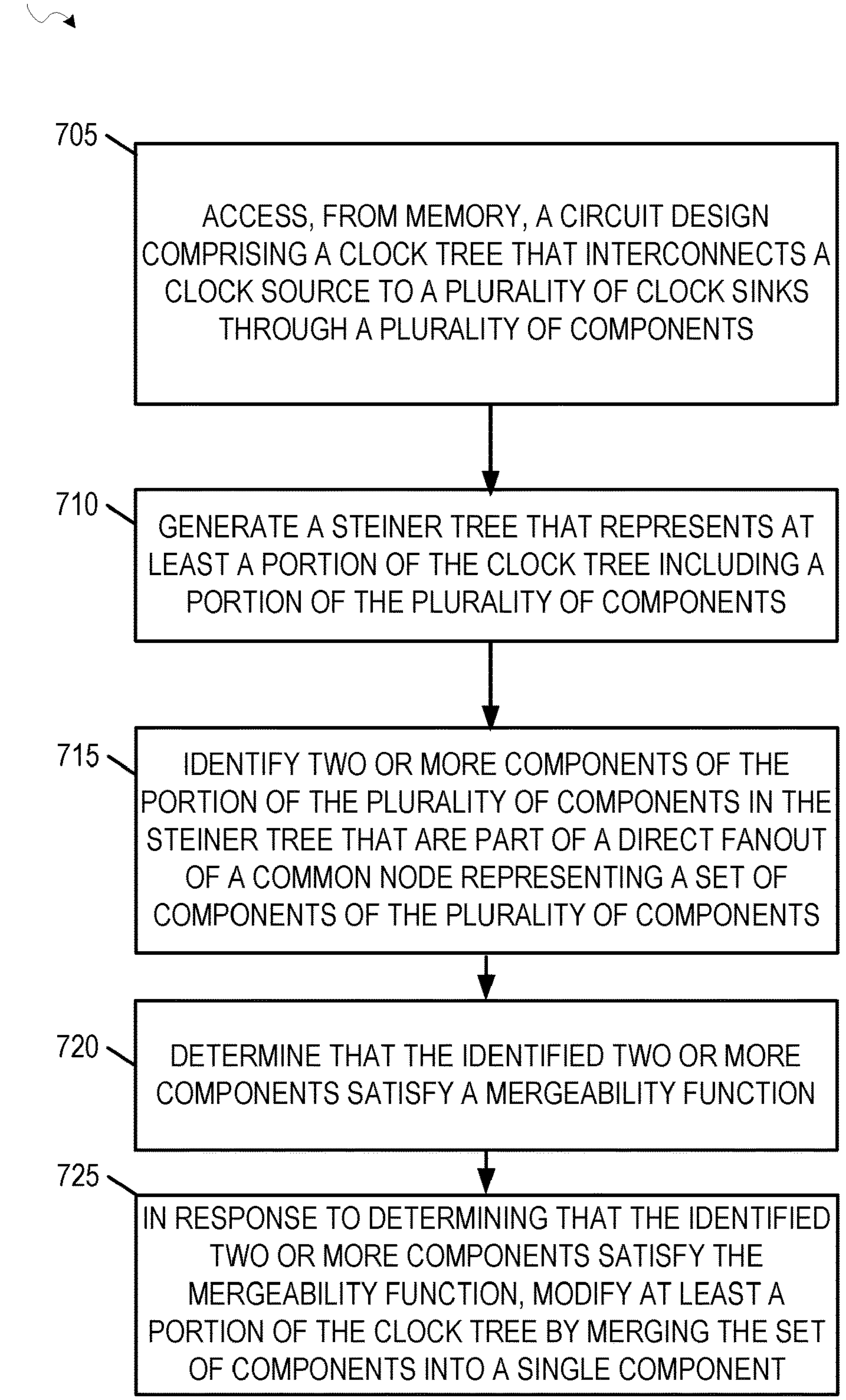
FIG. 7 illustrates an example method (or process) for modifying a post-CTS clock tree, in accordance with some disclosed examples.

FIG. 7 illustrates a method 700 for modifying a post-CTS clock tree, according to some examples. The method 700 begins with operation 705 in which a circuit design (e.g., integrated circuit design) stored in memory is accessed. This circuit design includes a clock tree that interconnects a clock source to a plurality of clock sinks through a plurality of components. After accessing the post-CTS clock tree, in operation 710, a Steiner tree is generated that represents at least a portion of the clock tree including a portion of the plurality of components. Then, at operation 715, two or more components of the portion of the plurality of components in the Steiner tree that are part of a direct fanout of a common node representing a set of components of the plurality of components are identified and, at operation 720, a determination is made as to whether the identified two or more components satisfy a mergeability function. At operation 725, in response to determining that the identified two or more components satisfy the mergeability function, at least a portion of the clock tree is modified by merging the set of components into a single component. The method 700 may be executed multiple times on a post-CTS clock tree to iteratively modify the clock tree until an appropriate number of merges are performed.

Figure 8:
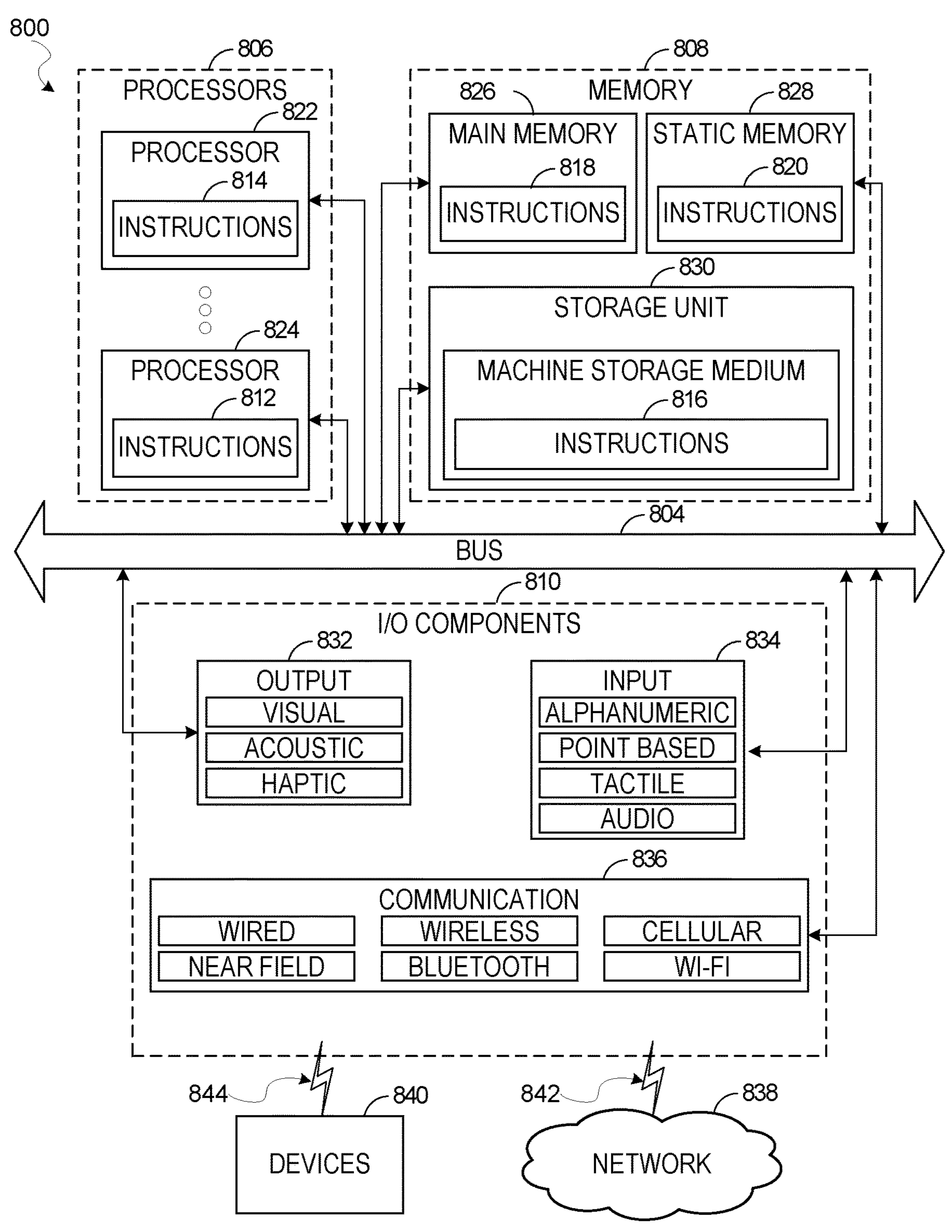
FIG. 8 is a functional block diagram of an example computing system for carrying out methods and operations described herein, in accordance with some examples.

FIG. 8 is a functional block diagram of a computing system 800 for executing method 700 and other processes described above, along with other embodiments of the present disclosure. The computing system 800 may execute an EDA software system and for performing the method 700, and other processes described above, in accordance with some embodiments of the present disclosure. A machine 802 is shown in the form of a computer system within which a set of instructions may be executed for causing the machine to perform any one or more of the method 700 and other methodologies discussed herein, according to some embodiments. Specifically, FIG. 8 shows a diagrammatic representation of the machine in the example form of a computing system 800. The computing system 800 may include a bus 804, processors 806, memory 808, and I/O components 810, which may be configured to communicate with each other such as via the bus 804. The machine may include instructions 812-820 (e.g., software, a program, an application, an applet, an app, or other executable code) for causing the machine to perform any one or more of the methodologies discussed herein may be executed. For example, the instructions 812-820 may cause the machine to execute an EDA software system that executes the above processes described in the above description. The instructions 812-820 transform the general, non-programmed machine into a particular machine programmed to carry out the described and illustrated functions in the manner described here. In alternative embodiments, the machine operates as a standalone device or may be coupled (e.g., networked) to other machines. In a networked deployment, the machine may operate in the capacity of a server machine or a client machine in a server-client network environment, or as a peer machine in a peer-to-peer (or distributed) network environment. The machine may comprise, but not be limited to, a server computer, a client computer, a personal computer (PC), a tablet computer, a laptop computer, a netbook, a smart phone, a mobile device, a), a network router, a network switch, a network bridge, or any machine capable of executing the instructions 812-820, sequentially or otherwise, that specify actions to be taken by the machine. Further, while only a single machine is illustrated, the term "machine" shall also be taken to include a collection of machines that individually or jointly execute the instructions 812-820 to perform any one or more of the methodologies discussed herein.

In an example embodiment, the processors 806 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 822 and a processor 824 that may execute the instructions 814, 812. The term "processor" is intended to include multi-core processors 806 that may comprise two or more independent processors (sometimes referred to as "cores") that may execute instructions contemporaneously. Although FIG. 8 shows multiple processors 806, the machine may include a single processor with a single core, a single processor with multiple cores (e.g., a multi-core processor), multiple processors with a single core, multiple processors with multiple cores, or any combination thereof.

The memory 808 may include a main memory 826, a static memory 828, and a storage unit 830, both accessible to the processors 806 such as via the bus 804. The main memory 826, the static memory 828, and the storage unit 830 store the instructions 816-820 embodying any one or more of the processes, methodologies or functions described herein. The instructions 812-820 may also reside, completely or partially, within the main memory 826, within the static memory 828, within the storage unit 820, within at least one of the processors 806 (e.g., within the processor's cache memory), or any suitable combination thereof, during execution thereof by the machine.

The I/O components 810 may include a wide variety of components to receive input, provide output, produce output, transmit information, exchange information, capture measurements, and so on. The specific I/O components 810 that are included in a particular machine will depend on the type of machine. For example, portable machines such as mobile phones will likely include a touch input device or other such input mechanisms, while a headless server machine will likely not include such a touch input device. It will be appreciated that the I/O components 810 may include many other components that are not shown in FIG. 8. The I/O components 810 are grouped according to functionality merely for simplifying the following discussion and the grouping is in no way limiting. In various example embodiments, the I/O components 810 may include output components 832 and input components 834. The output components 832 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 834 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 810 may include communication components 836 operable to couple the machine to a network 838 or devices 840 via a coupling 842 and a coupling 844, respectively. For example, the communication components 836 may include a network interface component or another suitable device to interface with the network 838. In further examples, the communication components 836 may include wired communication components, wireless communication components, cellular communication components, and other communication components to provide communication via other modalities. The devices 840 may be another machine or any of a wide variety of peripheral devices (e.g., a peripheral device coupled via a universal serial bus (USB)).

Executable Instructions and Machine Storage Medium

The various memories (e.g., 808, 818, 820 and/or memory of the processor(s) 806, 822, 824) and/or the storage unit 830 may store one or more sets of instructions and data structures (e.g., software) embodying or utilized by any one or more of the methodologies or functions described herein. These instructions, when executed by the processor(s) 806, cause various operations to implement the disclosed embodiments.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 838 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 838 or a portion of the network 838 may include a wireless or cellular network, and the coupling 842 may be a Code Division Multiple Access (CDMA) connection, a Global System for Mobile communications (GSM) connection, or another type of cellular or wireless coupling. In this example, the coupling 842 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE)

technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 812-820 may be transmitted or received over the network 838 using a transmission medium via a network interface device (e.g., a network interface component included in the communication components 836) and utilizing any one of a number of well-known transfer protocols (e.g., hypertext transfer protocol [HTTP]). Similarly, the instructions 812-820 may be transmitted or received using a transmission medium via the coupling 844 (e.g., a peer-to-peer coupling) to the devices 840. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 812-820 for execution by the machine 802, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A method comprising:

accessing, from memory, a circuit design comprising a clock tree that interconnects a clock source to a plurality of clock sinks through a plurality of components;

generating a routing tree that represents at least a portion of the clock tree including a portion of the plurality of components;

identifying two or more components of the portion of the plurality of components in the routing tree that are part of a direct fanout of a common node representing a set of components of the plurality of components;

determining that the identified two or more components satisfy a mergeability function that defines whether or not components can be merged; and in response to determining that the identified two or more components satisfy the mergeability function, modifying at least a portion of the clock tree by merging the set of components into a single component.

2. The method of claim 1, wherein the routing tree comprises a Steiner tree, and wherein the two or more components comprise a pair of inverters, and wherein the set of components comprise a pair of inverters.

3. The method of claim 1, wherein the two or more components comprise a pair of logic cells with identical functions, and wherein the set of components comprise a pair of logic cells with identical functions.

4. The method of claim 1, wherein the common node is coupled to the clock source, a buffer, or an inverter.

5. The method of claim 1, wherein a wirelength of the circuit design is increased by a negligible amount in response to merging the set of components into the single component.

6. The method of claim 1, wherein merging the set of components into the single component comprises merging the set of components without increasing a wirelength of the circuit design.

7. The method of claim 1, comprising in response to determining that the identified two or more components satisfy the mergeability function:

accessing user constraints, transition constraints, and timing constraints associated with the circuit design; and conditionally merging the two or more components into the single component in response to determining that merging the set of components continue to satisfy the user constraints, transition constraints, and timing constraints associated with the circuit design.

8. The method of claim 1, wherein generating the routing tree comprises:

selecting a net driver from the clock tree;

identifying a group of components of the plurality of components that are part of a direct fanout of the net driver;

within the group of components, identifying a first set of components that are mergeable and a second set of components that are not mergeable;

excluding the first set of components from the routing tree while including a third set of components in a fanout path from the first set of components and including the second set of components, each of the third set of components and the second set of components being associated with a respective initial point in the routing tree.

9. The method of claim 8, wherein the routing tree is constructed with locations of inputs to the direct fanout of the net driver which is not mergeable and locations of the inputs to a fanout of the direct fanout which is mergeable.

10. The method of claim 8, comprising:

generating horizontal and vertical line segments from the net driver to each component of the third set of components and the second set of components, the routing tree comprising a set of routing points at junctions and corners where perpendicular line segments of the horizontal and vertical line segments meet.

11. The method of claim 10, comprising:

searching the horizontal and vertical line segments to find a set of initial points having multiple edges; and replacing the set of initial points with merge points.

12. The method of claim 11, comprising:

removing any routing point of the set of routing points from the routing tree having only two edges; and marking a remaining set of the routing points as merge points.

13. The method of claim 12, comprising:

traversing the merge points of the routing tree in a bottom up or top down manner to identify merge candidates for which respective components directly connected to the respective merge point satisfy the mergeability function.

14. The method of claim 13, comprising:

determining whether the merge candidates satisfy additional constraints associated with the circuit design to conditionally merge the merge candidates.

15. The method of claim 1, comprising:

generating a merge tree based on the routing tree, wherein the mergeability function is evaluated using the merge tree.

16. A non-transitory computer readable medium comprising instructions that, when executed by at least one processor, configure the at least one processor to perform operations comprising:

accessing, from memory, a circuit design comprising a clock tree that interconnects a clock source to a plurality of clock sinks through a plurality of components;

generating a routing tree that represents at least a portion of the clock tree including a portion of the plurality of components;

identifying two or more components of the portion of the plurality of components in the routing tree that are part of a direct fanout of a common node representing a set of components of the plurality of components;

determining that the identified two or more components satisfy a mergeability function that defines whether or not components can be merged; and in response to determining that the identified two or more components satisfy the mergeability function, modifying at least a portion of the clock tree by merging the set of components into a single component.

17. The non-transitory computer readable medium of claim 16, wherein the two or more components comprise a pair of inverters.

18. The non-transitory computer readable medium of claim 16, wherein the two or more components comprise a pair of buffers.

19. The non-transitory computer readable medium of claim 16, wherein a wirelength of the circuit design is increased by a negligible amount in response to merging the set of components into the single component.

20. A system comprising:

one or more processors; and a memory storing instructions that, when executed by the one or more processors, cause the system to perform operations comprising:

accessing, from memory, a circuit design comprising a clock tree that interconnects a clock source to a plurality of clock sinks through a plurality of components;

generating a routing tree that represents at least a portion of the clock tree including a portion of the plurality of components;

identifying two or more components of the portion of the plurality of components in the routing tree that are part of a direct fanout of a common node representing a set of components of the plurality of components;

determining that the identified two or more components satisfy a mergeability function that defines whether or not components can be merged; and in response to determining that the identified two or more components satisfy the mergeability function, modifying at least a portion of the clock tree by merging the set of components into a single component.

* * * * *